United States Patent
Zhou

(10) Patent No.: US 10,522,613 B2
(45) Date of Patent: Dec. 31, 2019

(54) MANUFACTURING METHOD OF A RESISTANCE DEVICE HAVING A FIN

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Beijing) Corp., Beijing (CN); Semiconductor Manufacturing International (Shanghai) Corp., Shanghai (CN)

( * ) Notice: Subject to any disclaimer, the term of this patent is extended or adjusted under 35 U.S.C. 154(b) by 0 days.

(21) Appl. No.: 15/974,136

(22) Filed: May 8, 2018

(65) Prior Publication Data
US 2019/0006456 A1 Jan. 3, 2019

(30) Foreign Application Priority Data
Jun. 29, 2017 (CN) .......................... 2017 1 0510885

(51) Int. Cl.
*H01L 49/02* (2006.01)
*H01L 29/06* (2006.01)
*H01L 21/3105* (2006.01)
*H01L 21/3205* (2006.01)
*H01L 21/762* (2006.01)
*H01L 21/8234* (2006.01)
*H01L 27/06* (2006.01)
*H01L 29/78* (2006.01)

(52) U.S. Cl.
CPC ........ *H01L 28/20* (2013.01); *H01L 21/31053* (2013.01); *H01L 21/32051* (2013.01); *H01L 21/76224* (2013.01); *H01L 29/0649* (2013.01); *H01L 21/823431* (2013.01); *H01L 21/823481* (2013.01); *H01L 27/0629* (2013.01); *H01L 29/7851* (2013.01)

(58) Field of Classification Search
CPC ................. H01L 28/20; H01L 29/0649; H01L 21/31053; H01L 21/32051; H01L 21/76224; H01L 21/823481; H01L 29/7851; H01L 21/823431; H01L 29/06; H01L 21/3105; H01L 21/762; H01L 21/8234; H01L 27/06; H01L 29/78
USPC ....................................................... 257/506
See application file for complete search history.

(56) References Cited

U.S. PATENT DOCUMENTS

| 2016/0020210 A1* | 1/2016 | Liaw ................. H01L 29/66545 257/369 |
| 2016/0064327 A1* | 3/2016 | Lin ..................... H01L 27/0629 257/368 |
| 2017/0047251 A1* | 2/2017 | Lee .................... H01L 21/76895 |
| 2017/0084721 A1* | 3/2017 | Hung ................ H01L 29/66795 |

(Continued)

*Primary Examiner* — Alexander O Williams
(74) *Attorney, Agent, or Firm* — Brinks Gilson & Lione

(57) ABSTRACT

A resistance device includes a substrate, a fin on the substrate, a trench isolation structure formed around the fin. The resistance device further includes at least one first dummy gate structure on the fins, an inter-layer dielectric layer on the trench isolation structure, where the inter-layer dielectric layer covers the fin and the at least one first dummy gate structure. The resistance device further includes a resistance material layer on the inter-layer dielectric layer.

10 Claims, 19 Drawing Sheets

(56) References Cited

U.S. PATENT DOCUMENTS

| | | | |
|---|---|---|---|
| 2017/0194203 A1* | 7/2017 | Hung | H01L 21/823431 |
| 2018/0076086 A1* | 3/2018 | Clevenger | H01L 21/76852 |
| 2018/0308952 A1* | 10/2018 | Adusumilli | H01L 29/665 |
| 2018/0331225 A1* | 11/2018 | Liaw | H01L 29/7848 |
| 2019/0006360 A1* | 1/2019 | Tung | H01L 27/0924 |
| 2019/0027604 A1* | 1/2019 | Lee | H01L 29/66545 |
| 2019/0043964 A1* | 2/2019 | Lin | H01L 29/66795 |
| 2019/0058050 A1* | 2/2019 | Hsu | H01L 29/6656 |
| 2019/0123175 A1* | 4/2019 | Hsu | H01L 29/66795 |

* cited by examiner

MANUFACTURING METHOD OF A RESISTANCE DEVICE HAVING A FIN

The present disclosure claims priority to Chinese Patent Application No. 201710510885.3, filed on Jun. 29, 2017, the entire disclosure of which is hereby incorporated by reference.

BACKGROUND

Technical Field

The present disclosure relates to the field of semiconductor technologies, and in particular, to resistance devices and a manufacturing method thereof.

Related Art

As sizes of metal oxide semiconductor field effect transistor (MOSFET) devices are reduced, a short channel effect (SCE for short) becomes more dramatic. Fin field effect transistor (FinFET) devices display relatively desirable gate control capabilities for channel charges. As a result, sizes of complementary metal oxide semiconductor (CMOS) devices based on FinFET can be further reduced with insignificant SCE problems.

In a system-on-a-chip (SOC) system, a resistance device is an important device element. In an existing manufacturing process, resistance devices may be disposed on some structure layers. For example, a resistance device may be disposed on an inter-layer dielectric layer, but procedures such as planarization of the inter-layer dielectric layer may be involved in the manufacturing process. The planarization process may create recesses in the inter-layer dielectric layer on which the resistance device is formed. Consequently, uniformity of the resistance device becomes poor. Especially in a process of manufacturing a resistance device and another FinFET device at the same time, a planarization procedure of an inter-layer dielectric layer and a metal gate may be involved, and the inter-layer dielectric layer may form a recesses. Consequently, uniformity of the devices is relatively poor, and metal residues may be formed, affecting performance of the devices and a product yield.

SUMMARY

A technical problem needing to be resolved by the present disclosure is to provide a resistance device, so that the resistance device has relatively desirable uniformity.

In some implementations, a resistance device is disclosed. The resistance device includes a substrate, a fin on the substrate, a trench isolation structure formed around the fin, at least one first dummy gate structure on the fin, an inter-layer dielectric layer on the trench isolation structure, wherein the inter-layer dielectric layer covers the fin and the at least one first dummy gate structure, and a resistance material layer on the inter-layer dielectric layer.

In some implementations of the resistance device above, the resistance material layer may include at least one of titanium nitride (TiN) and tantalum nitride (TaN).

In some implementations of the resistance device above, the trench isolation structure may include first trench isolation portions at two ends of the fin extending along a direction perpendicular to an extension direction of the fin and second trench isolation portions at two sides the fin extending along a direction parallel to the extension direction of the fin. The resistance material layer may be located above the first trench isolation portions, and the resistance material layer may extend along a direction parallel to an extension direction of the first trench isolation portions.

In some implementations of the resistance device above, the resistance material layer may be between the fin and another fin on the substrate.

In some implementations of the resistance device above, the inter-layer dielectric layer may include a first dielectric layer on the trench isolation structure and a second dielectric layer on the first dielectric layer, where the first dielectric layer covers the fin, an upper surface of the first dielectric layer is flush with an upper surface of the at least one first dummy gate structure, the second dielectric layer covers the upper surface of the at least one first dummy gate structure, and the resistance material layer is located on the second dielectric layer.

In some implementations of the resistance device above, each of the at least one first dummy gate structure may include a first dummy gate insulator layer on the fin, a first dummy gate layer on the first dummy gate insulator layer, and first spacer layers on two side surfaces of the first dummy gate layer. The second dielectric layer may covers an upper surface of the first dummy gate layer.

In some implementations of the resistance device above, the at least one first dummy gate structure may include at least two isolated first dummy gate structures formed on two ends of the fin, and the resistance device may further include an electrode on the fin and between the at least two isolated first dummy gate structures.

In some implementations of the resistance device above may further include a second dummy gate structure on the first trench isolation portions, wherein an upper surface of the second dummy gate structure is flush with the upper surface of the first dielectric layer, and the second dielectric layer covers the upper surface of the second dummy gate structure.

In some implementations of the resistance device above, the second dummy gate structure may include a second dummy gate insulator layer on the first trench isolation portions, a second dummy gate layer on the second dummy gate insulator layer, a hard mask layer on the second dummy gate layer, and second spacer layers on two side surfaces of the second dummy gate layer. The second dielectric layer may cover an upper surface of the hard mask layer.

In some implementations of the resistance device above, the second dummy gate layer may include undoped polysilicon.

In some implementations of the resistance device above may further include an insulator covering layer covering the resistance material layer and a first contact element and a second contact element that pass through the insulator covering layer and are in contact with two ends of the resistance material layer.

A resistance device manufacturing method is further disclosed. The method includes providing a semiconductor structure, wherein the semiconductor structure includes a substrate, a fin on the substrate, and a trench isolation structure formed around the fin. The method further includes forming at least one first dummy gate structure on the fin and an inter-layer dielectric layer on the trench isolation structure, wherein the inter-layer dielectric layer covers the fin and the at least one first dummy gate structure. The method further includes forming a resistance material layer on the inter-layer dielectric layer.

In some implementations of the method above, the resistance material layer may include at least one of titanium nitride (TiN) and tantalum nitride (TaN).

In some implementations of the method above, the trench isolation structure may include first trench isolation portions at two ends of the fin extending along a direction perpendicular to an extension direction of the fin and second trench isolation portions at two sides of the fin extending along a direction parallel to the extension direction of the fin, and the resistance material layer is located above the first trench isolation portions, and the resistance material layer extends along a direction parallel to an extension direction of the first trench isolation portions.

In some implementations of the method above, the resistance material layer may be between the fin and another fin on the substrate.

In some implementations of the method above, the inter-layer dielectric layer may include a first dielectric layer on the trench isolation structure and a second dielectric layer on the first dielectric layer, where the first dielectric layer covers the fin, an upper surface of the first dielectric layer is flush with an upper surface of the at least one first dummy gate structure, the second dielectric layer covers the upper surface of the first at least one dummy gate structure; and the resistance material layer is formed on the second dielectric layer.

In some implementations of the method above, the step of forming the at least one first dummy gate structure and the inter-layer dielectric layer may include forming at least one original gate structure on the fin, by forming a first original gate insulator layer on the fin, forming a first original gate layer on the first original gate insulator layer, and forming first spacer layers on two side surfaces of the first original gate layer. The step may further include forming a first dielectric layer on the trench isolation structure, wherein the first dielectric layer covers the at least one original gate structure, performing planarization on the semiconductor structure with the first dielectric layer to expose an upper surface of the first original gate layer, removing the first original gate layer and a part of the first original gate insulator layer, to form a recess exposing a portion of the fin, forming, in the recess, a first dummy gate insulator layer on the exposed portion of the fin and a first dummy gate layer on the first dummy gate insulator layer, and forming, on the first dielectric layer, the second dielectric layer that covers an upper surface of the first dummy gate layer.

In some implementations of the method above and in the step of forming the at least one original gate structure, two isolated original gate structures are formed on two ends of the fin, and before forming the first dielectric layer, the method may further include forming an electrode on the fin between the two isolated original gate structures.

In some implementations of the method above, the step of forming the at least one original gate structure may further include forming a second dummy gate structure on the first trench isolation portions, and where, in the step of performing the planarization, the planarization causes an upper surface of the second dummy gate structure to be flush with an upper surface of the first dielectric layer, and where, in the step of forming the second dielectric layer, the second dielectric layer covers the upper surface of the second dummy gate structure.

In some implementations of the method above, forming the second dummy gate structure may include forming a second dummy gate insulator layer on the first trench isolation portions, forming a second dummy gate layer on the second dummy gate insulator layer, forming a hard mask layer on the second dummy gate layer, and forming second spacer layers on two side surfaces of the second dummy gate layer. In the step of forming the second dielectric layer, the second dielectric layer may cover the hard mask layer.

In some implementations of the method above, the second dummy gate layer may include undoped polysilicon.

In some implementations of the method above, the method may further include forming an insulator covering layer that covers the resistance material layer and forming a first contact element and a second contact element that pass through the insulator covering layer and are in contact with two ends of the resistance material layer.

According to detailed descriptions of exemplary implementations of the present disclosure with reference to the following accompanying drawings, other features and other advantages of the present disclosure will become clear.

BRIEF DESCRIPTION OF THE DRAWINGS

The accompanying drawings constitute a part of this specification and illustrate various implementations, and are used, together with this specification, to explain the principle of the present disclosure.

DETAILED DESCRIPTION

Various exemplary implementations of the present disclosure are described herein in detail with reference to the accompanying drawings. It should be noted that, unless otherwise specified, relative layout of the parts and the steps, numerical expressions, and values that are described in the implementations do not limit the scope of the present disclosure.

Meanwhile, it should be understood that, for convenience of description, sizes of the parts shown in the accompanying drawings are not drawn according to actual ratios.

The following exemplary implementations are merely illustrative, and do not limit the present disclosure and application or use of the present disclosure.

Technologies, methods, and devices that are known by a person of ordinary skill in the art may not be discussed in detail. These technologies, methods, and devices shall be considered as a part of the disclosure.

In all examples shown and discussed herein, any specific value shall be considered as being merely exemplary rather than limiting. Therefore, another implementation may use a different value.

It should be noted that similar reference signs, labels, and letters in the following accompanying drawings and description represent similar items. Therefore, once one item is defined in one accompanying drawing, the item does not need to be further discussed in subsequent accompanying drawings.

Figure 1:
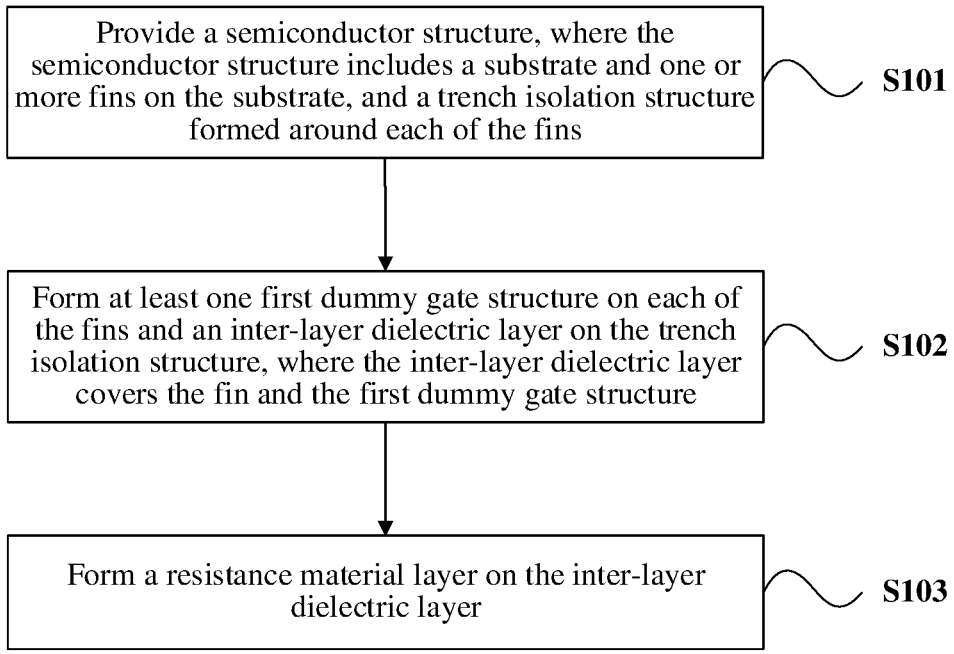
FIG. 1 is a flowchart of a manufacturing method for a resistance device.

FIG. 1 is a flowchart of a resistance device manufacturing method.

In step S101, a semiconductor structure is provided. The semiconductor structure includes a substrate and one or more fins on the substrate. A trench isolation structure is formed around each of the fins.

In some implementations, in the step of S101, the trench isolation structure may include first trench isolation portions that are at two ends of each of the fins and that extend along a direction perpendicular to an extension direction of the fin and second trench isolation portions that are at two sides of each of the fins and that extend along a direction parallel to the extension direction of the fin. In some implementations, the substrate may be a semiconductor substrate, for example, a silicon substrate. In some implementations, the fin may be a semiconductor fin, for example, a silicon fin.

In step S102, at least one first dummy gate structure is formed on each of the fins, and an inter-layer dielectric layer is formed on the trench isolation structure. The inter-layer dielectric layer covers the fin and the first dummy gate structure.

In some implementations, the inter-layer dielectric layer includes a first dielectric layer on the trench isolation structure and a second dielectric layer on the first dielectric layer. The first dielectric layer covers the fin, and an upper surface of the first dielectric layer is flush with an upper surface of the first dummy gate structure. The second dielectric layer covers the upper surface of the first dummy gate structure.

In step S103, a resistance material layer is formed on the inter-layer dielectric layer. For example, the resistance material layer is formed on the second dielectric layer.

In some implementations, in step S103, the resistance material layer is formed above a first trench isolation portion, and the resistance material layer extends along a direction parallel to an extension direction of the first trench isolation portion. Preferably, the resistance material layer is formed above a first trench isolation portion between two adjacent fins.

In the foregoing implementations, a resistance device manufacturing method is provided. In the manufacturing method, after a semiconductor structure is provided, a first dummy gate structure is formed on each fin of the semiconductor structure, and an inter-layer dielectric layer is formed to cover the fin and the first dummy gate structure, and then a resistance material layer is formed on the inter-layer dielectric layer, to form a resistance device. Because the first dummy gate structure is formed on each fin, the inter-layer dielectric layer may be prevented from having a recess in a process of forming the inter-layer dielectric layer, for example, in a process of performing planarization on the inter-layer dielectric layer. Therefore, uniformity of the resistance device can be improved.

The manufacturing method may improve the uniformity of the resistance device, and may especially improve uniformity of the resistance device and another FinFET device. Because another FinFET device may also need to be manufactured in the process of manufacturing the resistance device, similar to an existing manufactured FinFET device, in this implementation of the present disclosure, in the process of manufacturing the resistance device, the fin, the dummy gate structure on the fin, the inter-layer dielectric layer, and the like are also manufactured, so that the thickness of the manufactured resistance device and the thickness of the another FinFET device are as uniform or consistent as possible. This can improve the uniformity of the device.

Preferably, a material of the resistance material layer may include TiN and/or TaN. For example, a resistivity of TiN or TaN may be from 400 ohm/square (ohm/sq) to 1000 ohm/sq. In various implementations, TiN alone may be used as the resistance material layer, TaN alone may be used as the resistance material layer, or TiN and TaN in combination may be used as the resistance material layer, so that a desirable temperature characteristics and a desirable voltage characteristics of the resistance device may be achieved.

FIG. 2A to FIG. 15C are schematic top views or schematic cross-sectional views of a structure at several stages in an exemplary processes of manufacturing resistance devices. The following describes this exemplary process in detail with reference to FIG. 2A to FIG. 15C.

First, the following describes a process of forming a semiconductor structure with reference to FIG. 2A to FIG. 4C.

Figure 2A:
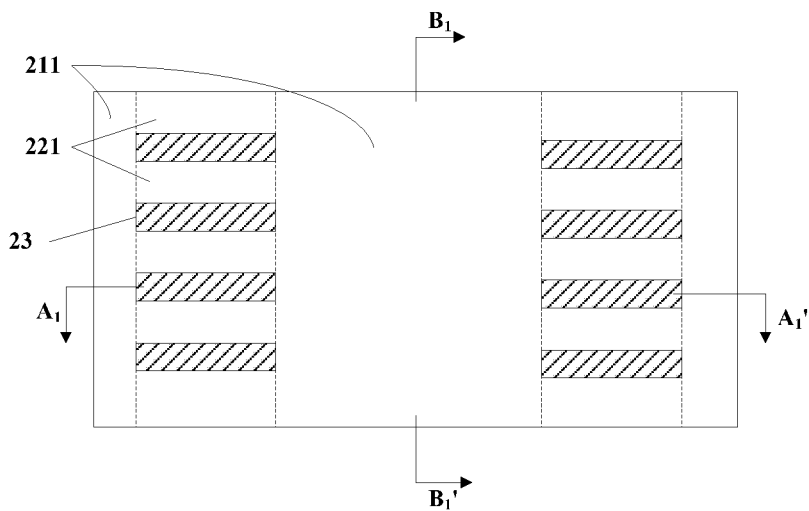
FIG. 2A is a schematic top view of a structure at a stage in a process of manufacturing a resistance device.
Figure 2B:
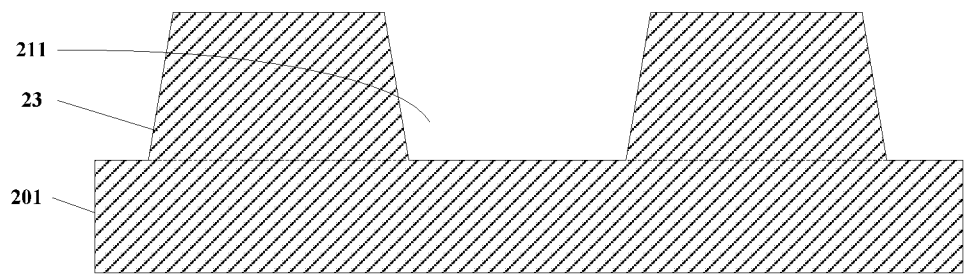
FIG. 2B is a schematic cross-sectional view of the structure along a line A1-A1' in FIG. 2A.
Figure 2C:
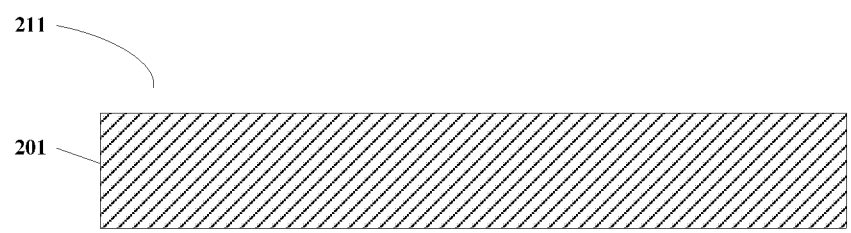
FIG. 2C is a schematic cross-sectional view of the structure along a line B1-B1' in FIG. 2A.

For example, as shown in FIG. 2A, FIG. 2B, and FIG. 2C, an original structure is provided. The original structure may include a substrate (for example, a silicon substrate) 201 and one or more fins 23 on the substrate 201. A trench may be formed around each of the fins. The trench may include first trenches 211 that are at two ends of each of the fins 23 and that extend along a direction perpendicular to an extension direction of the fin 23 and second trenches 221 that are at two sides of each of the fins 23 and that extend along a direction parallel to the extension direction of the fin 23.

Figure 3A:
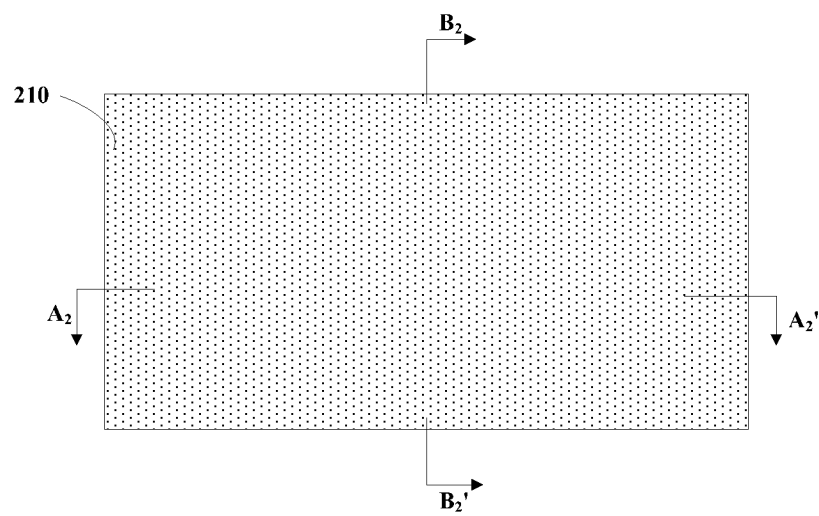
FIG. 3A is a schematic top view of a structure at a stage in a process of manufacturing a resistance device.
Figure 3B:
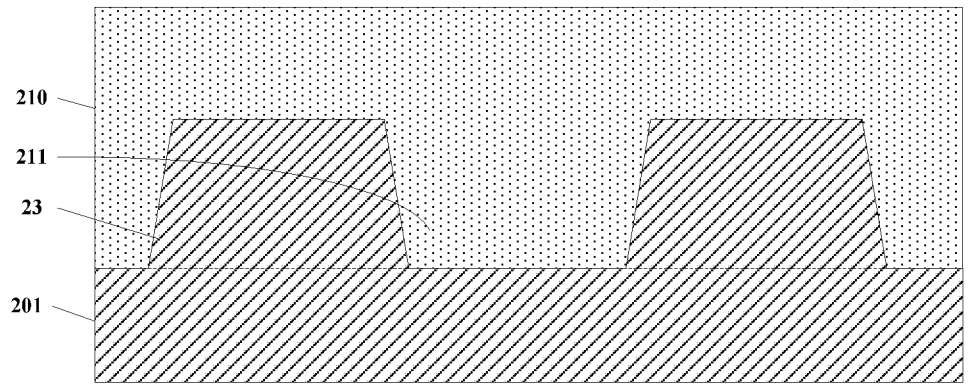
FIG. 3B is a schematic cross-sectional view of the structure along a line A2-A2' in FIG. 3A.
Figure 3C:
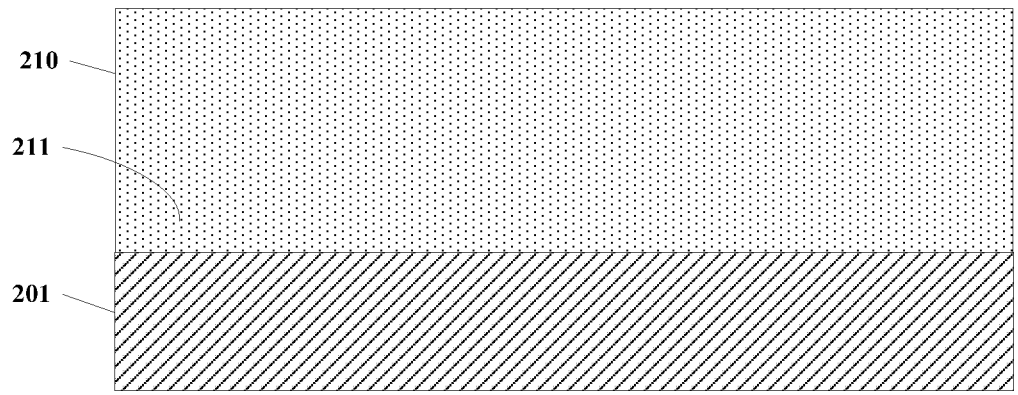
FIG. 3C is a schematic cross-sectional view of the structure along a line B2-B2' in FIG. 3A.

Next, as shown in FIG. 3A, FIG. 3B, and FIG. 3C, a trench insulator layer (for example, silicon dioxide) 210 is deposited to fill the first trenches 211 and the second trenches 221.

Figure 4A:
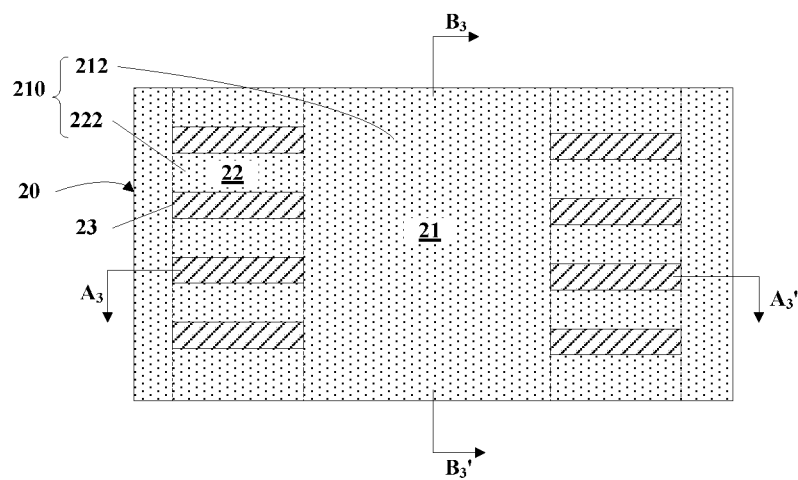
FIG. 4A is a schematic top view of a structure at a stage in a process of manufacturing a resistance device.
Figure 4B:
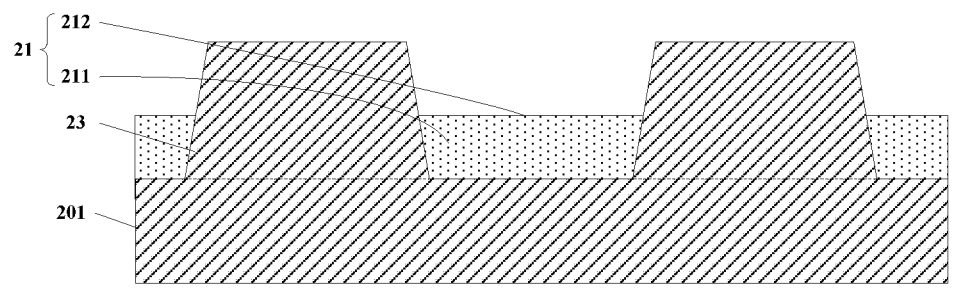
FIG. 4B is a schematic cross-sectional view of the structure along a line A3-A3' in FIG. 4A.
Figure 4C:
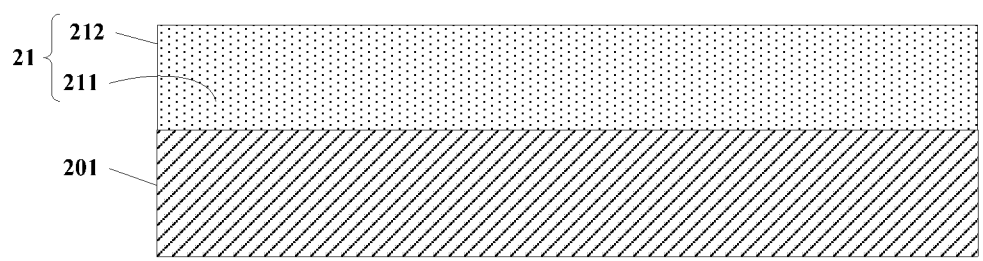
FIG. 4C is a schematic cross-sectional view of the structure along a line B3-B3' in FIG. 4A.

Next, as shown in FIG. 4A, FIG. 4B, and FIG. 4C, recess processing is performed on the trench insulator layer 210 by using an etching procedure, to expose a portion of the fin 23. The remaining trench insulator layer 210 partially (in height) fills the trenches. A portion of the trench insulator layer, which fills the first trenches 211, is referred to as a first trench insulator layer 212, and a portion of the trench insulator layer, which fills the second trenches 221, is referred to as a second trench insulator layer 222.

In this step, a trench isolation structure 20 is formed around each fin. As shown in FIG. 4A, the trench isolation structure 20 may include first trench isolation portions 21 that are at two ends of each of the fins 23 and that extend along a direction perpendicular to an extension direction of the fin 23 and second trench isolation portions 22 that are at two sides of each of the fins 23 and that extend along a direction parallel to the extension direction of the fin 23. The first trench isolation portions 21 may include the first trenches 211 and the first trench insulator layer 212 partially filling the first trenches 211. The second trench isolation portions 22 may include the second trenches 221 and the trench insulator layer 222 partially filling the second trenches 221.

As such, the semiconductor structure shown in FIG. 4A to FIG. 4C is formed. The semiconductor structure may include the substrate 201 and the one or more fins 23 on the substrate 201. The trench isolation structure 20 is formed around each fin 23.

Next, after the semiconductor structure shown in FIG. 4A to FIG. 4C is formed, the manufacturing method may further include: forming at least one first dummy gate structure on each fin and an inter-layer dielectric layer on the trench isolation structure. The following describes a process of forming the first dummy gate structure and the inter-layer dielectric layer in detail with reference to FIG. 5A to FIG. 11C.

Figure 5A:
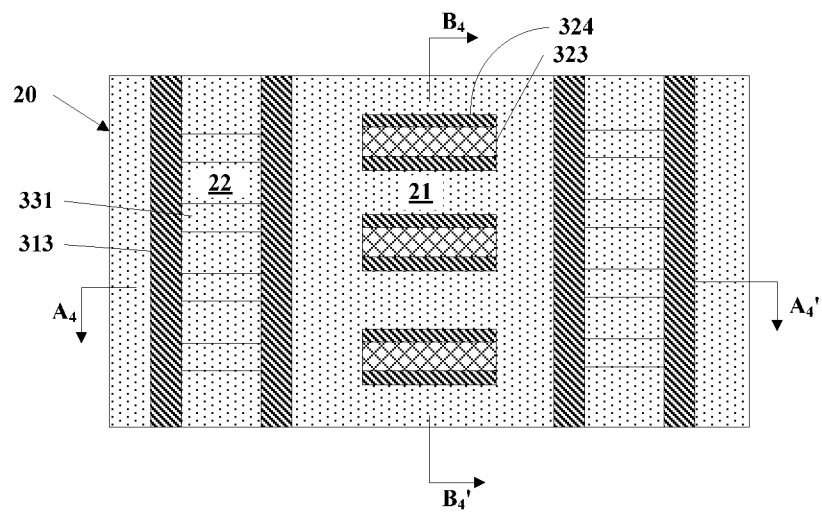
FIG. 5A is a schematic top view of a structure at a stage in a process of manufacturing a resistance device.
Figure 5B:
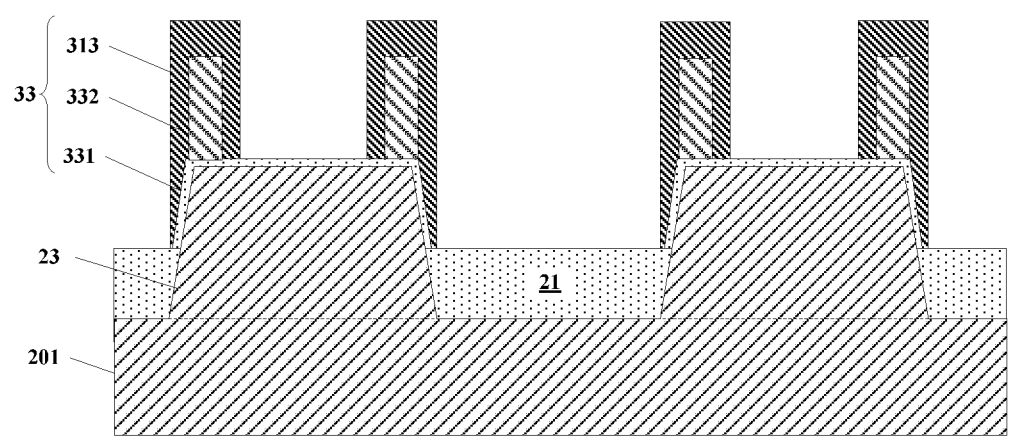
FIG. 5B is a schematic cross-sectional view of the structure along a line A4-A4' in FIG. 5A.

For example, as shown in FIG. 5A and FIG. 5B, at least one original gate structure 33 is formed on each fin 23. For example, two isolated original gate structures 33 are formed on each fin 23. The two original gate structures 33 are separately on two ends of the fin. The original gate structure 33 may cross over the second trench isolation portions 22 on two sides of the fin. The original gate structure 33 may include: a first original gate insulator layer (for example, silicon dioxide) 331 on a surface of the fin, a first original gate layer (for example, polysilicon) 332 on the first original gate insulator layer 331, and first spacer layers 313 on two side surfaces of the first original gate layer 332. Optionally, the first spacer layer 313 may alternatively be formed on an upper surface of the first original gate layer 332.

Figure 5C:
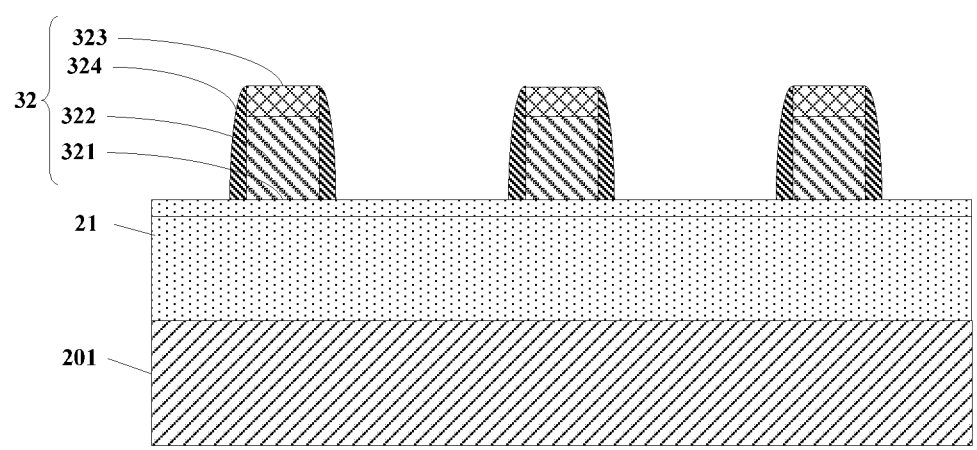
FIG. 5C is a schematic cross-sectional view of the structure along a line B4-B4' in FIG. 5A.

Preferably, in the step of forming the original gate structure, as shown in FIG. 5A and FIG. 5C, at least one (for example, as shown in the figure, three) second dummy gate structure 32 may also be formed on a first trench isolation portion 21. The second dummy gate structure 32 may include: a second dummy gate insulator layer (for example, silicon dioxide) 321 on the first trench isolation portion 21, a second dummy gate layer 322 on the second dummy gate insulator layer 321, a hard mask layer (for example, silicon nitride) 323 on the second dummy gate layer 322, and second spacer layers (silicon dioxide and/or silicon nitride) 324 on two side surfaces of the second dummy gate layer 322. By forming the second dummy gate structure as base and support, an inter-layer dielectric layer under a resistance material layer (to be described below) may be prevented from having a recess in a subsequent step of performing planarization on the inter-layer dielectric layer. Therefore, uniformity of the device can be improved.

In some implementations, a material of the second dummy gate layer 322 may include polysilicon. Preferably, a material of the second dummy gate layer may include undoped polysilicon. Because polysilicon is undoped, and the conductivity is very low, no significant parasitic capacitor is formed between the second dummy gate layer and the resistance material layer that is to be formed subsequently, so that a crosstalk between the second dummy gate layer and the resistance material layer is relatively small, facilitating improvement of the uniformity of the resistance device.

Figure 6A:
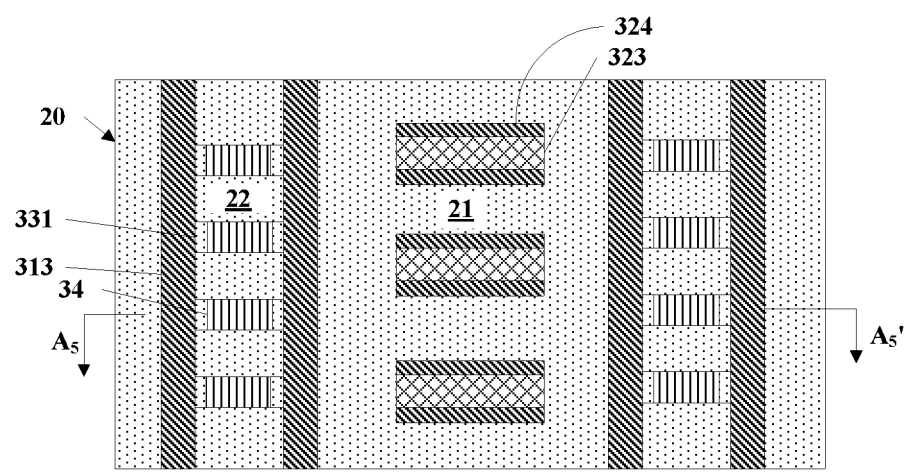
FIG. 6A is a schematic top view of a structure at a stage in a process of manufacturing a resistance device.
Figure 6B:
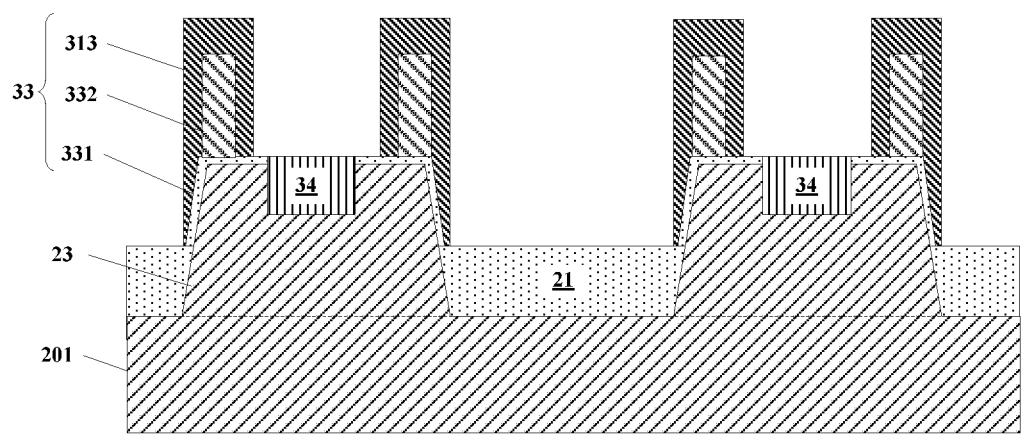
FIG. 6B is a schematic cross-sectional view of the structure along a line A5-A5' in FIG. 6A.

Next, optionally, as shown in FIG. 6A and FIG. 6B, for example, an electrode 34 is formed on a fin 23 and between two original gate structures 33 by using etching and epitaxial procedures. The electrode 34 may be used as a source or a drain. In some implementations, in a process of forming another FinFET device, epitaxy needs to be performed to form a source and a drain that are used for the FinFET device. Therefore, when another source and drain are formed, the same epitaxy process may be performed to form the electrode on the fin of the resistance device. This facilitates compatibility or synchronization with a manufacturing procedure of the another FinFET device, thereby facilitating improvement of the uniformity of the device.

Figure 7A:
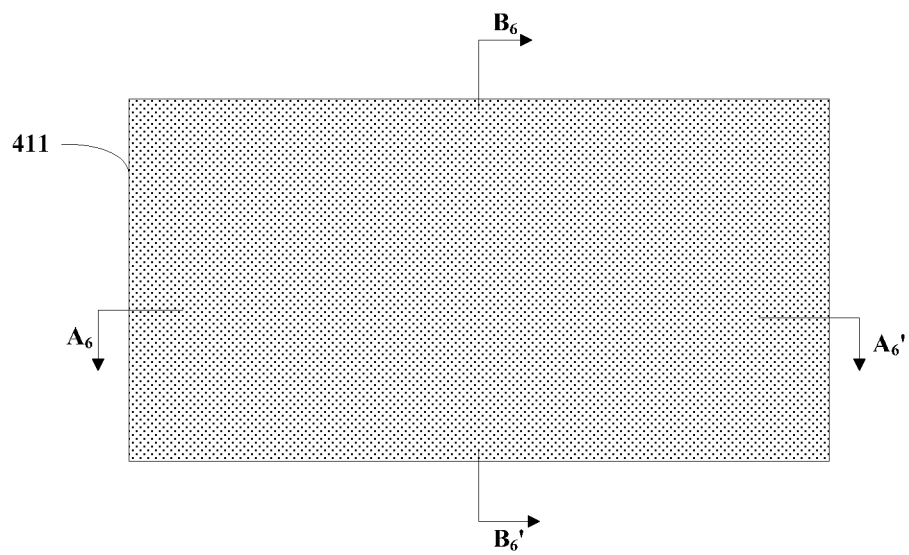
FIG. 7A is a schematic top view of a structure at a stage in a process of manufacturing a resistance device.
Figure 7B:
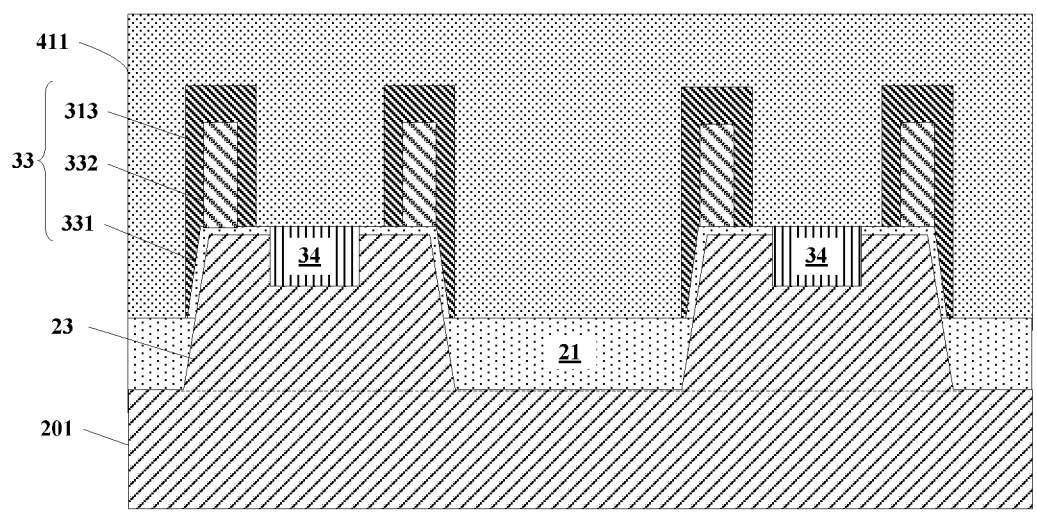
FIG. 7B is a schematic cross-sectional view of the structure along a line A6-A6' in FIG. 7A.
Figure 7C:
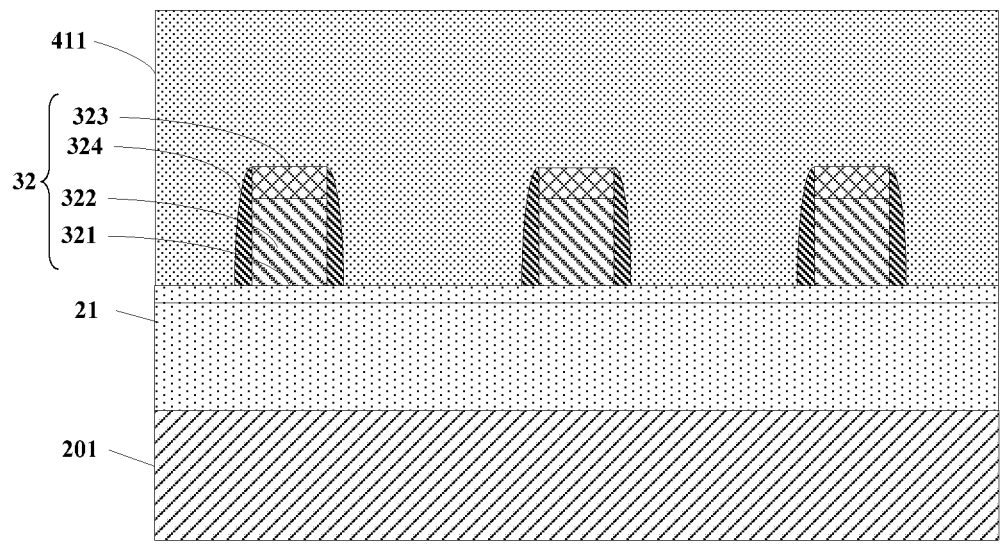
FIG. 7C is a schematic cross-sectional view of the structure along a line B6-B6' in FIG. 7A.

Next, as shown in FIG. 7A, FIG. 7B, and FIG. 7C, for example, a first dielectric layer (for example, silicon dioxide) 411 is formed on the trench isolation structure 20. The first dielectric layer 411 covers the original gate structure 33. In addition, the first dielectric layer may also cover the second dummy gate structure 32 and the electrode 34.

Figure 8A:
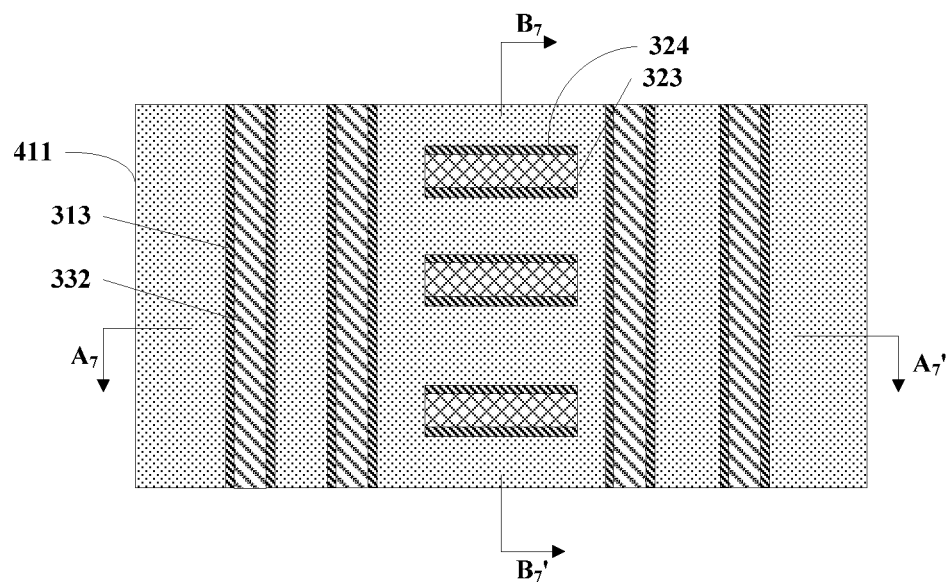
FIG. 8A is a schematic top view of a structure at a stage in a process of manufacturing a resistance device.
Figure 8B:
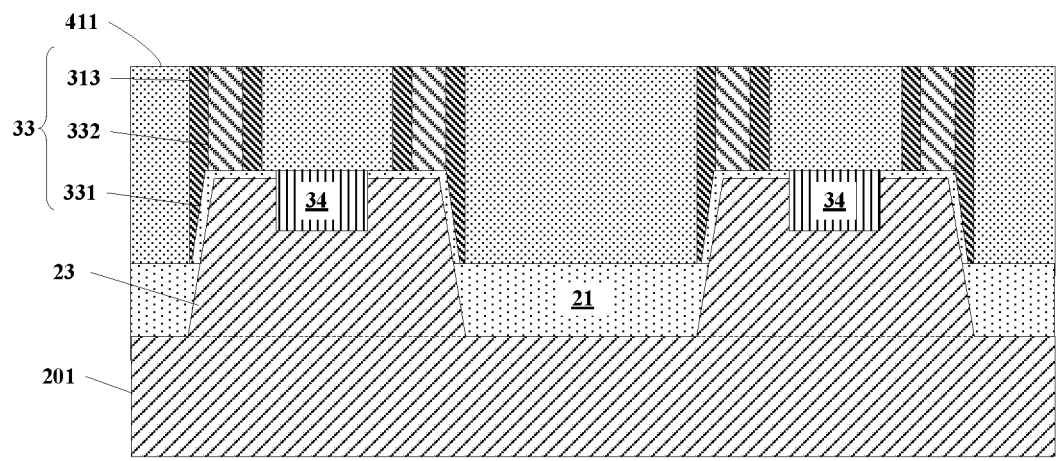
FIG. 8B is a schematic cross-sectional view of the structure along a line A7-A7' in FIG. 8A.
Figure 8C:
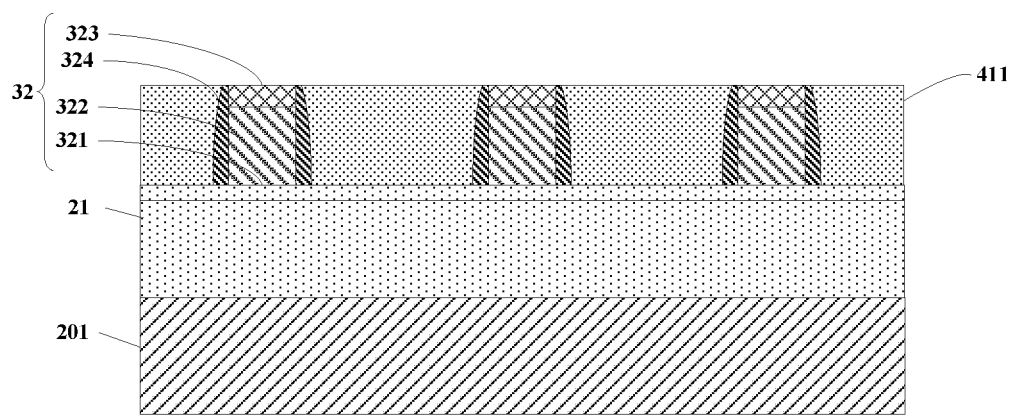
FIG. 8C is a schematic cross-sectional view of the structure along a line B7-B7' in FIG. 8A.

Next, as shown in FIG. 8A, FIG. 8B, and FIG. 8C, planarization (for example, chemical mechanical planarization (CMP)) is performed on the semiconductor structure on which the first dielectric layer 411 has been formed, to expose the upper surface of the first original gate layer 332. In the step of performing the planarization, the planarization may further cause an upper surface of the second dummy gate structure 32 to be flush with an upper surface of the first dielectric layer 411, that is, an upper surface of the first dummy gate structure 32 is exposed. For example, the hard mask layer 323 of the second dummy gate structure 32 may be used as a planarization stop layer to perform the planarization on the first dielectric layer 411, to expose an upper surface of the hard mask layer 32 while exposing the upper surface of the first original gate layer 332.

Figure 9A:
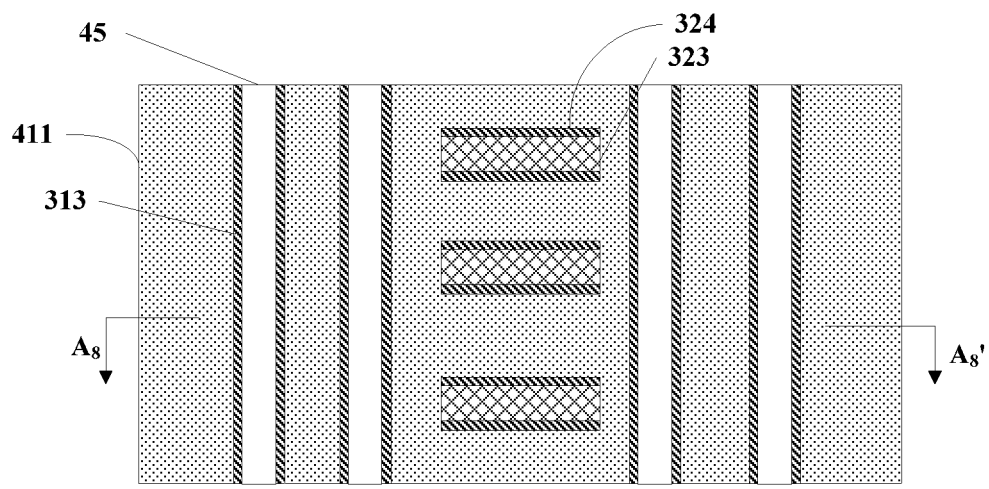
FIG. 9A is a schematic top view of a structure at a stage in a process of manufacturing a resistance device.
Figure 9B:
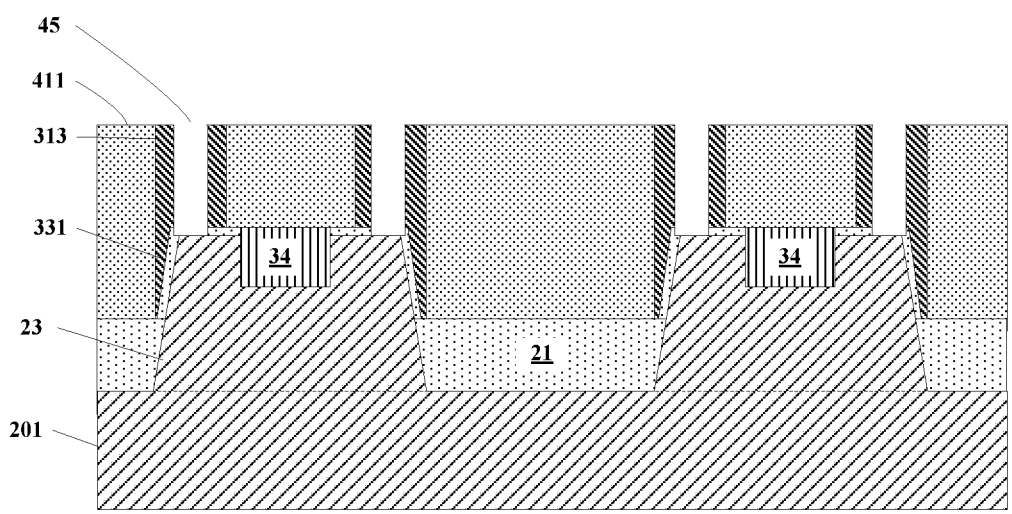
FIG. 9B is a schematic cross-sectional view of the structure along a line A8-A8' in FIG. 9A.

Next, as shown in FIG. 9A and FIG. 9B, the first original gate layer 332 and a portion of the first original gate insulator layer 331 are removed to form a recess 45 exposing a portion of the surface of the fin 23.

Figure 10A:
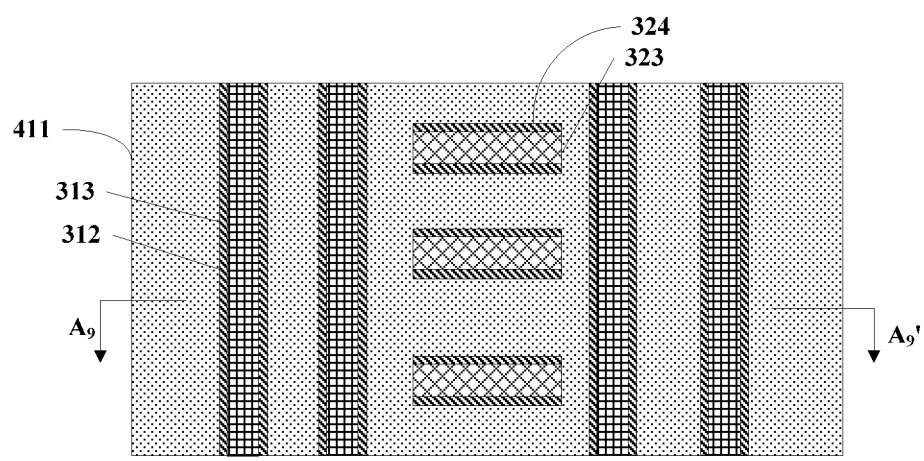
FIG. 10A is a schematic top view of a structure at a stage in a process of manufacturing a resistance device.
Figure 10B:
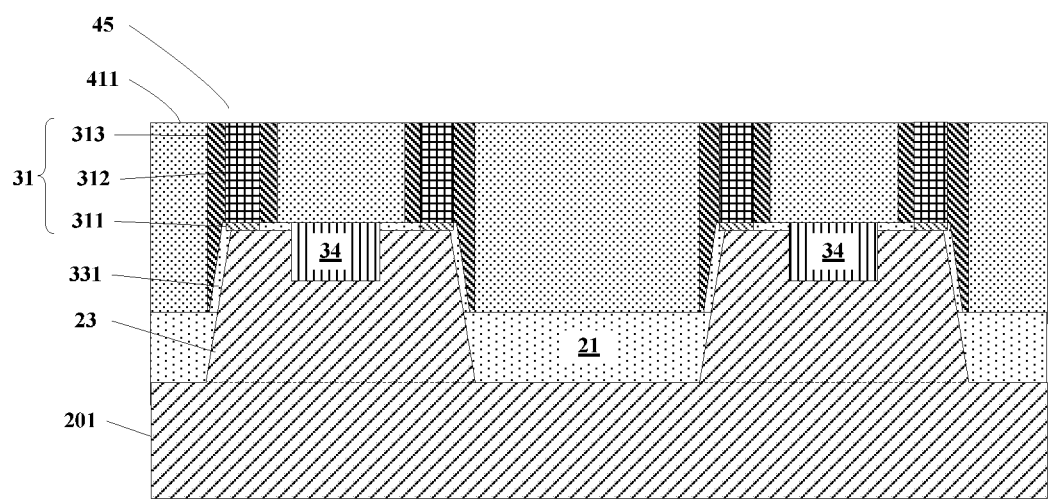
FIG. 10B is a schematic cross-sectional view of the structure along a line A9-A9' in FIG. 10A.

Next, as shown in FIG. 10A and FIG. 10B, a first dummy gate insulator layer 311 on the surface of the fin 23 and a first dummy gate layer 312 on the first dummy gate insulator layer 311 are formed in the recess 45. A material of the first dummy gate insulator layer 311 may include silicon dioxide or a high-dielectric-constant material layer (for example, hafnium dioxide (HfO2)). The first dummy gate layer 312 may include metal such as tungsten. A first dummy gate structure 31 is formed as a result. The first dummy gate structure 31 may include: a first dummy gate insulator layer 311 on the surface of the fin 23, a first dummy gate layer 312 on the first dummy gate insulator layer 311, and first spacer layers 313 on two side surfaces of the first dummy gate layer 312.

In some implementations, before the first dummy gate insulator layer 311 is formed, an interface layer (IL for short) may also be formed on the surface of the fin. For example, a material of the IL may be silicon dioxide. In some implementations, after the first dummy gate insulator layer 311 is formed and before the first dummy gate layer 312 is formed, a work function regulating layer may also be formed on the first dummy gate insulator layer, and then the first dummy gate layer is formed on the work function regulating layer. Therefore, the first dummy gate structure may further include the IL between the surface of the fin and the first dummy gate insulator layer and/or the work function regulating layer between the first dummy gate insulator layer and the first dummy gate layer.

Figure 11A:
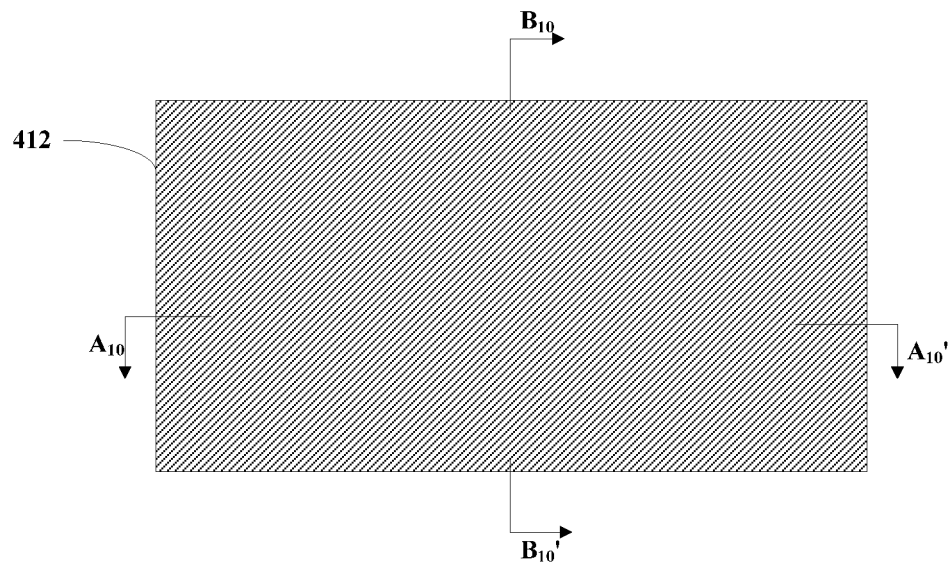
FIG. 11A is a schematic top view of a structure at a stage in a process of manufacturing a resistance device.
Figure 11B:
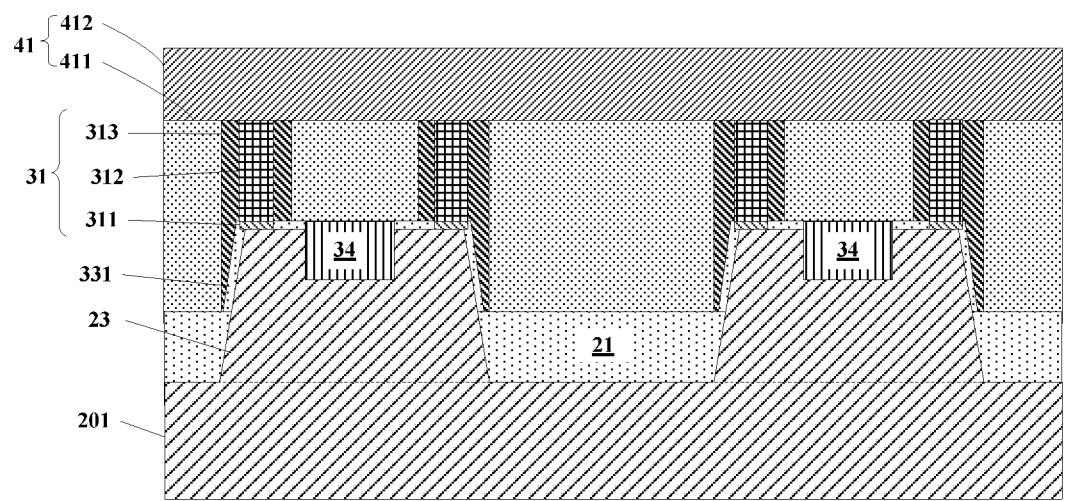
FIG. 11B is a schematic cross-sectional view of the structure along a line A10-A10' in FIG. 11A.
Figure 11C:
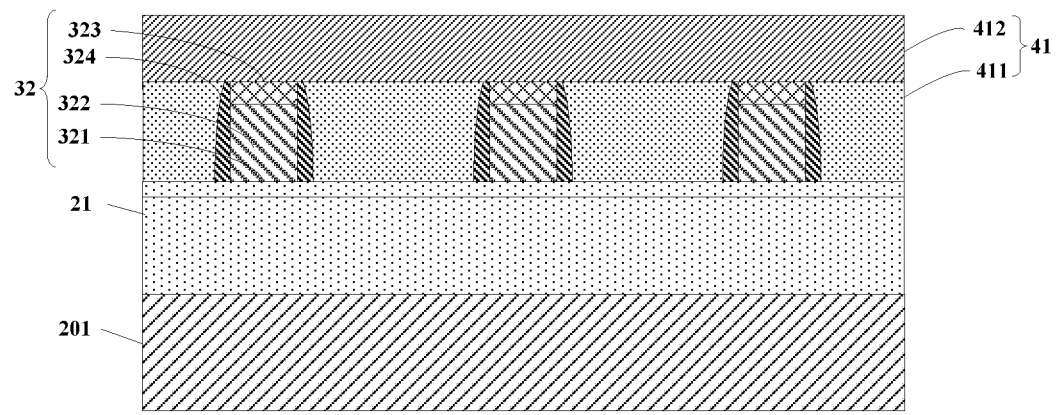
FIG. 11C is a schematic cross-sectional view of the structure along a line B10-B10' in FIG. 11A.

Next, as shown in FIG. 11A, FIG. 11B, and FIG. 11C, for example, by using a deposition procedure, a second dielectric layer (for example, silicon dioxide or silicon nitride) 412 that covers an upper surface of the first dummy gate layer 312 is formed on the first dielectric layer 411, to form an inter-layer dielectric layer 41. The inter-layer dielectric layer 41 may include the first dielectric layer 411 on the trench isolation structure and the second dielectric layer 412 on the first dielectric layer 411. The first dielectric layer 411 covers the fin, and an upper surface of the first dielectric layer 411 is flush with an upper surface of the first dummy gate structure 31. The second dielectric layer 412 covers the upper surface of the first dummy gate structure 31. In the step of forming the second dielectric layer, as shown in FIG. 11C, the second dielectric layer 412 may also cover the upper surface of the second dummy gate structure 32. For example, the second dielectric layer 32 may cover the upper surface of the hard mask layer 323.

As such, the first dummy gate structure 31, the second dummy gate structure 32, the electrode 34, and the inter-layer dielectric layer 41 are formed.

Figure 12A:
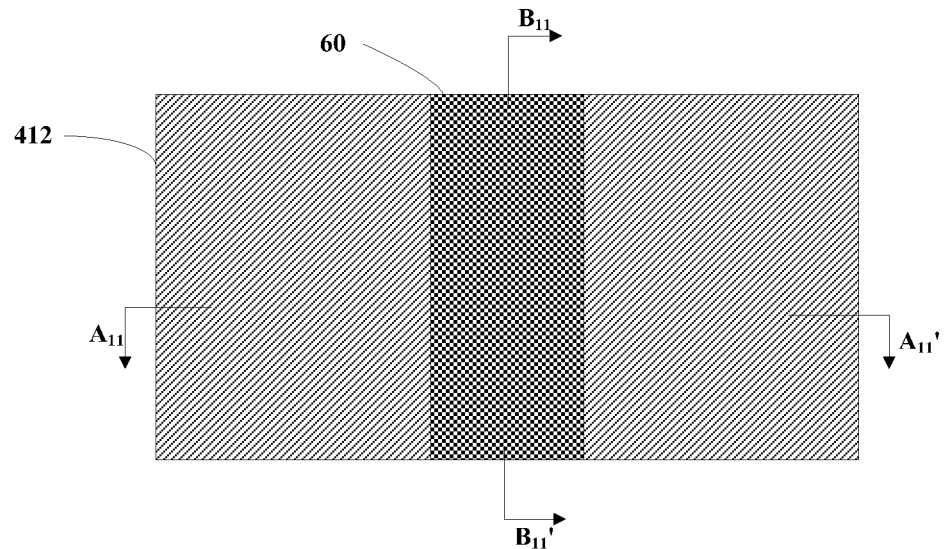
FIG. 12A is a schematic top view of a structure at a stage in a process of manufacturing a resistance device.
Figure 12B:
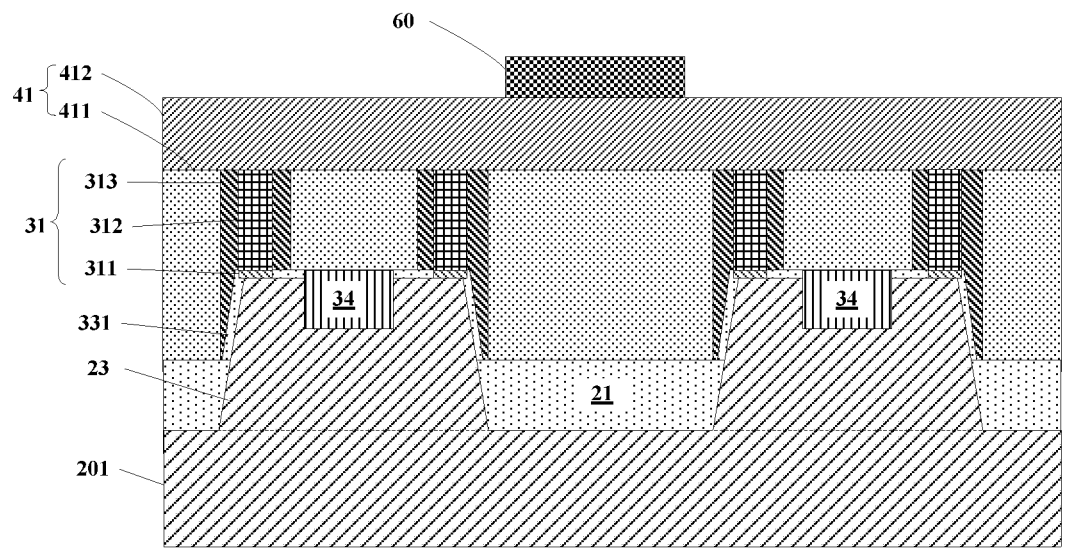
FIG. 12B is a schematic cross-sectional view of the structure along a line A11-A11' in FIG. 12A.
Figure 12C:
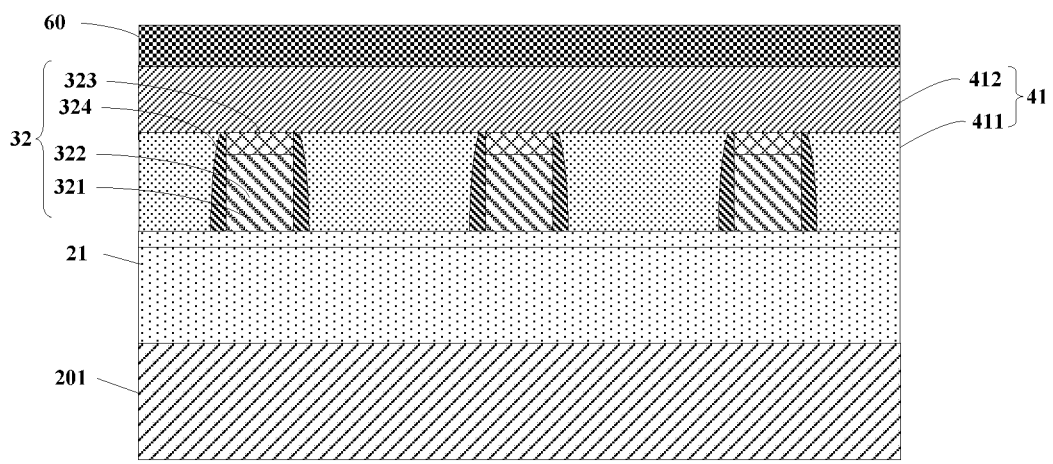
FIG. 12C is a schematic cross-sectional view of the structure along a line B11-B11' in FIG. 12A.

Next, as shown in FIG. 12A, FIG. 12B, and FIG. 12C, a resistance material layer 60 is formed on the inter-layer dielectric layer 41. For example, the resistance material layer 60 is formed on the second dielectric layer 412. Preferably, as shown in FIG. 12A to FIG. 12C, the resistance material layer 60 is formed above the first trench isolation portion 21, and the resistance material layer 60 extends along a direction parallel to an extension direction of the first trench isolation portion 21. Preferably, as shown in FIG. 12B, the resistance material layer 60 is formed above the first trench isolation portion 21 between two adjacent fins 23. A material of the resistance material layer 60 may include TiN and/or TaN.

In some implementations, a step of forming the resistance material layer may include: depositing the resistance material layer on the inter-layer dielectric layer, and then patterning the resistance material layer by using photoetching and etching procedures, to form the resistance material layer in a desired shape, as shown in FIG. 12A.

Figure 13A:
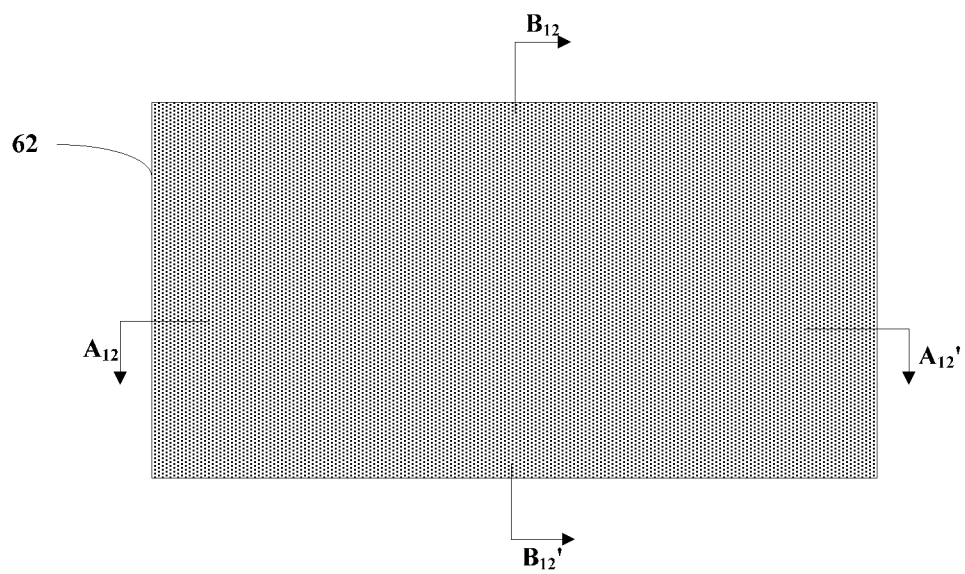
FIG. 13A is a schematic top view of a structure at a stage in a process of manufacturing a resistance device.
Figure 13B:
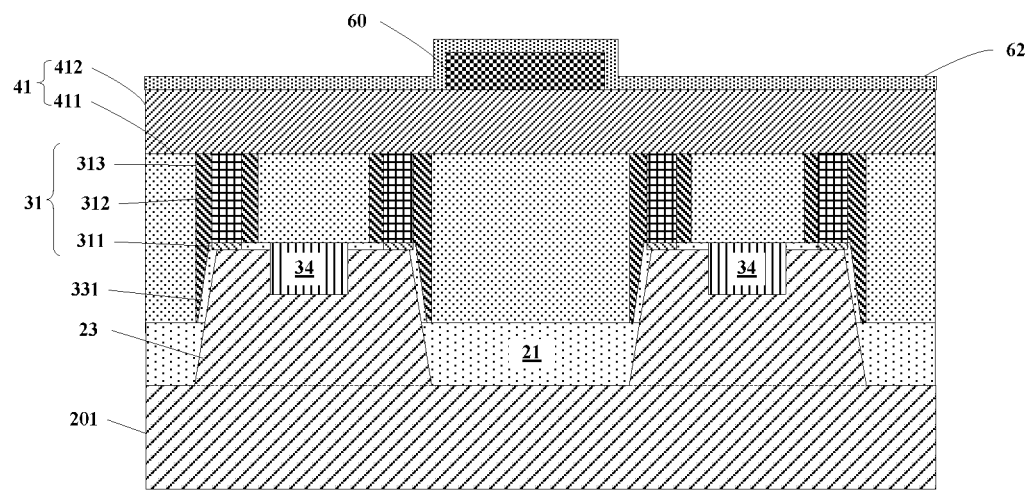
FIG. 13B is a schematic cross-sectional view of the structure along a line A12-A12' in FIG. 13A.
Figure 13C:
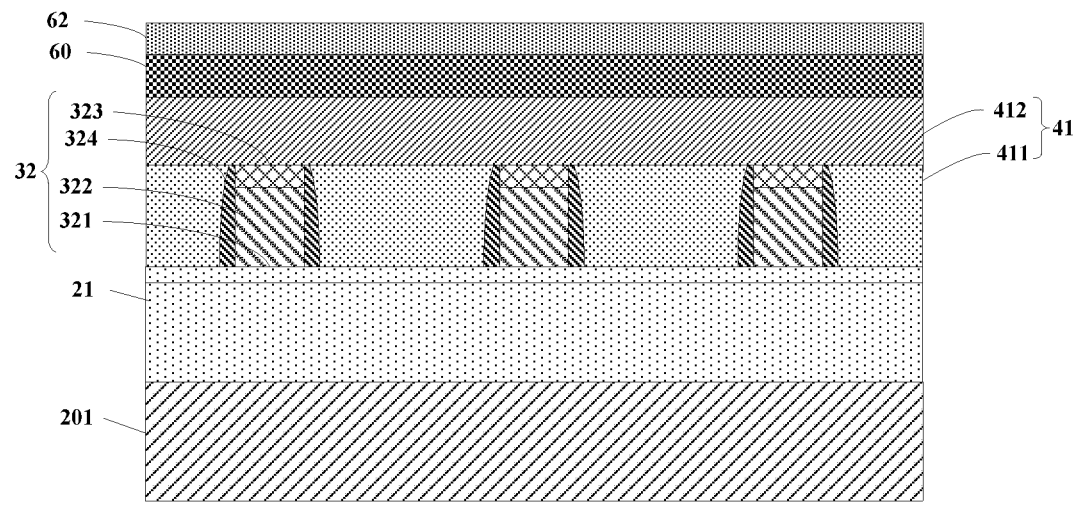
FIG. 13C is a schematic cross-sectional view of the structure along a line B12-B12' in FIG. 13A.

Next, as shown in FIG. 13A, FIG. 13B, and FIG. 13C, an insulator covering layer 62 covering the resistance material layer 60 is formed by using the deposition procedure. For example, a material of the insulator covering layer 62 may include silicon nitride.

Next, a first contact element 71 and a second contact element 72 that pass through the insulator covering layer 62 and that are respectively connected to two ends of the resistance material layer 60 are formed. The following describes the process in detail with reference to FIG. 14A to FIG. 14C and FIG. 15A to FIG. 15C.

Figure 14A:
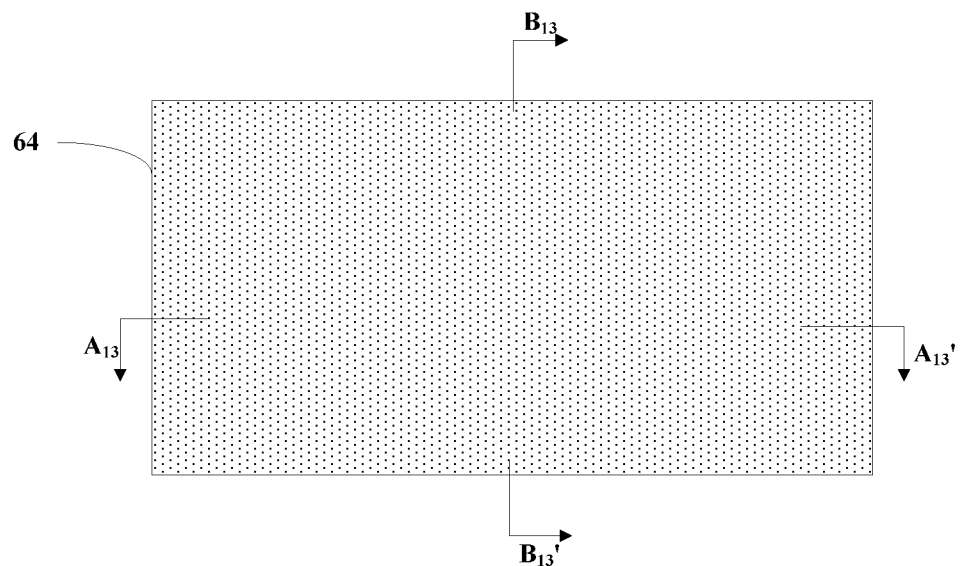
FIG. 14A is a schematic top view of a structure at a stage in a process of manufacturing a resistance device.
Figure 14B:
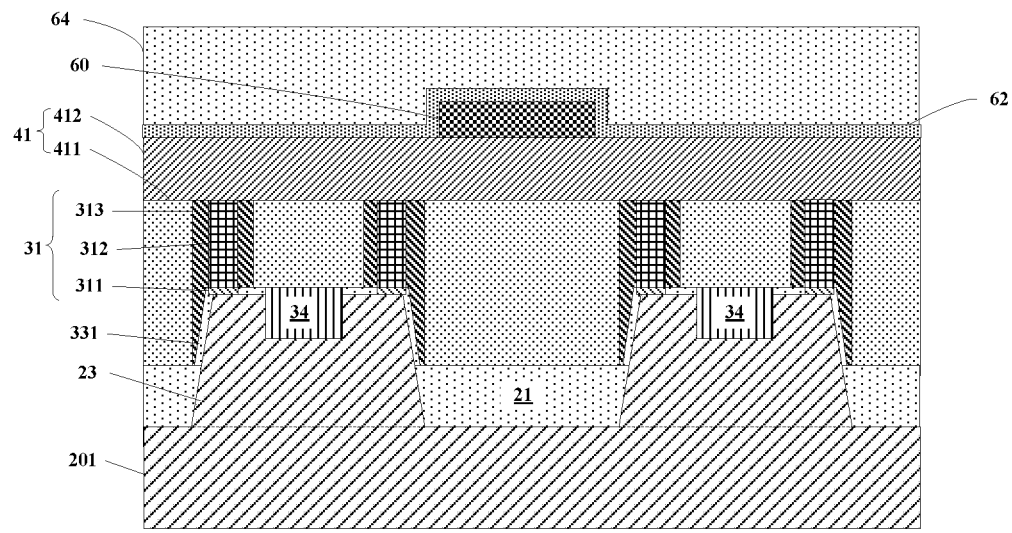
FIG. 14B is a schematic cross-sectional view of the structure along a line A13-A13' in FIG. 14A.
Figure 14C:
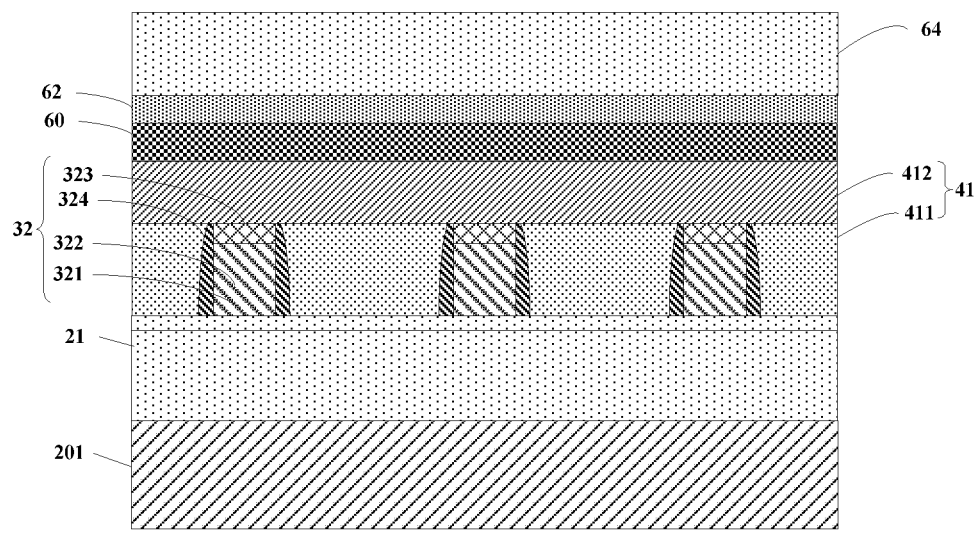
FIG. 14C is a schematic cross-sectional view of the structure along a line B13-B13' in FIG. 14A.

For example, as shown in FIG. 14A, FIG. 14B, and FIG. 14C, an intermetal dielectric layer (for example, silicon dioxide) 64 is deposited on the insulator covering layer 62.

Figure 15A:
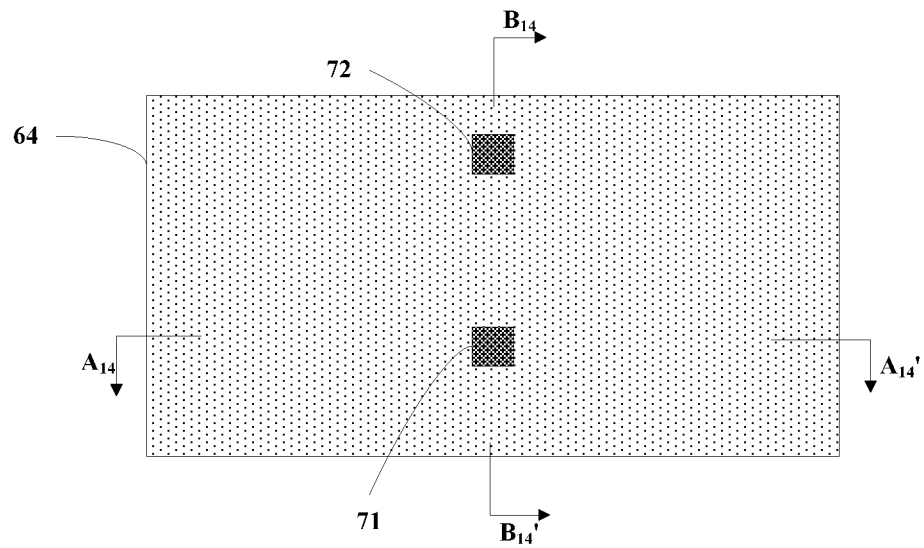
FIG. 15A is a schematic top view of a structure at a stage in a process of manufacturing a resistance device.
Figure 15B:
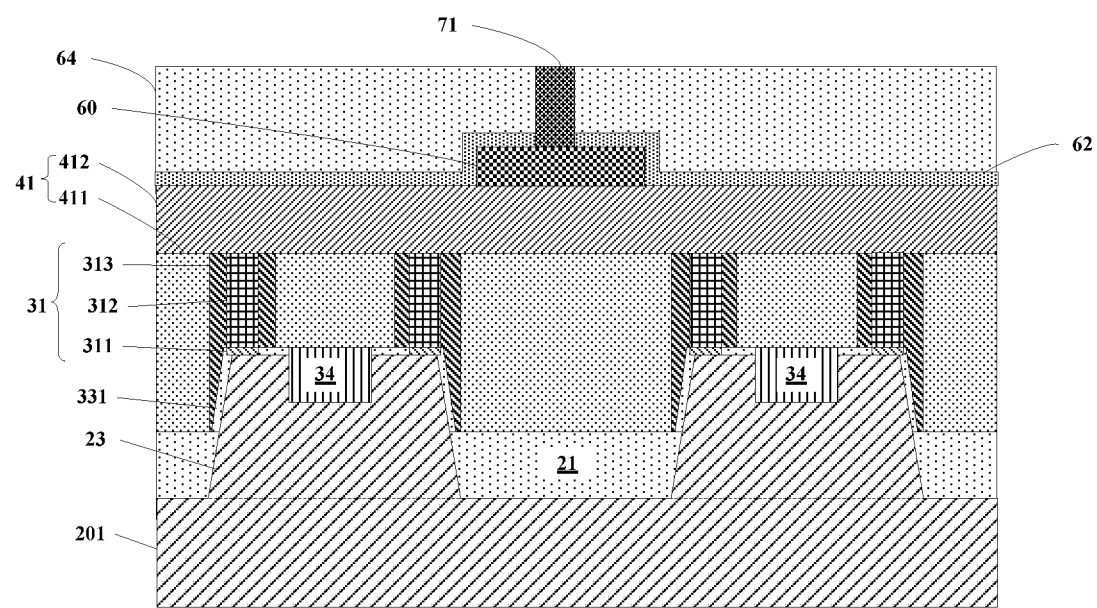
FIG. 15B is a schematic cross-sectional view of the structure along a line A14-A14' in FIG. 15A.
Figure 15C:
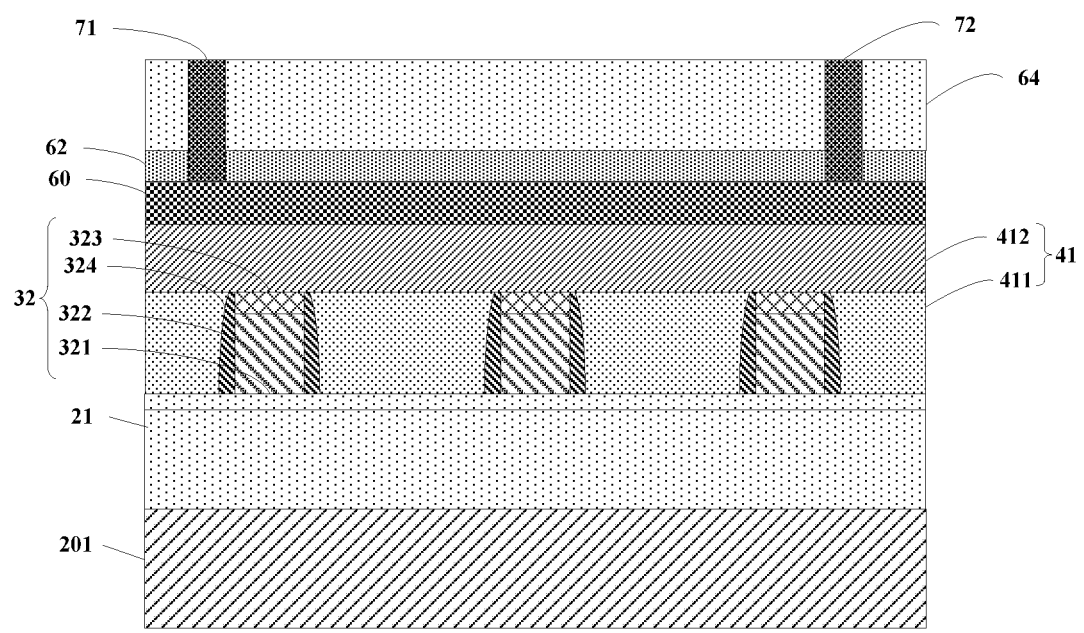
FIG. 15C is a schematic cross-sectional view of the structure along a line B14-B14' in FIG. 15A.

Next, as shown in FIG. 15A, FIG. 15B, and FIG. 15C, for example, by using etching and deposition procedures, the first contact element 71 and the second contact element 72 that pass through the intermetal dielectric layer 64 and the insulator covering layer 62 and that are respectively connected to the two ends of the resistance material layer 60 are formed. A material of the first contact element 71 and a material of the second contact element 72 may both include metal such as tungsten. For example, a first through hole and a second through hole that pass through the intermetal dielectric layer 64 and the insulator covering layer 62 may be formed by using the etching procedure. The first through hole and the second through hole expose the upper surface of the resistance material layer. Next, a contact element material layer is formed by using the deposition procedure, to fill the first through hole and the second through hole. Next, planarization (for example, CMP) is performed on the contact element material layer, to remove the contact element material layer beyond the first through hole and the second through hole. The contact element material layer remaining in the first through hole is used as the first contact element 71, and the contact element material layer remaining in the second through hole is used as the second contact element 72.

As such, the resistance device manufacturing method is provided. In the manufacturing method, a first dummy gate structure is formed on each fin, so that an inter-layer dielectric layer (for example, a first dielectric layer) may be prevented from having a recess in a step of performing planarization on the inter-layer dielectric layer, and uniformity may also be improved when planarization is performed on the dummy gate structure. Therefore, uniformity of the resistance device can be improved.

The manufacturing method of the present disclosure may minimize, as many as possible, metal residues caused by a recess of an inter-layer dielectric layer in the prior art, and mitigates a problem that a resistance device may suffer a short circuit with another adjacent device due to the metal residues.

Further, in the manufacturing method, a second dummy gate structure may be further formed on a first trench isolation portion, so that the inter-layer dielectric layer (for example, the first dielectric layer) under a resistance material layer may be prevented from having a recess in a step of performing planarization on the inter-layer dielectric layer, and uniformity may be further improved when planarization is performed on the dummy gate structure. Therefore, uniformity of a resistance device is further improved.

According to the manufacturing method in the implementations of the present disclosure, a resistance device is further formed. For example, as shown in FIG. 15B and FIG. 15C, the resistance device may include a substrate 201 and one or more fins 23 on the substrate 201. A trench isolation structure (that is, a trench isolation structure 20) is formed around each of the fins. The trench isolation structure may include first trench isolation portions 21 that are at two ends of each of the fins 23 and that extend along a direction perpendicular to an extension direction of the fin 23 and second trench isolation portions 22 that are at two sides of each of the fins 23 and that extend along a direction parallel to the extension direction of the fin 23.

As shown in FIG. 15B, the resistance device may further include at least one first dummy gate structure 31 on each of the fins 23. For example, two isolated first dummy gate structures 31 are formed on each fin 23. The two first dummy gate structures 31 are respectively on two ends of the fin 23. The first dummy gate structure 31 may cross over the second trench isolation portions 22 on two sides of the fin. In an implementation, the first dummy gate structure 31 may include: a first dummy gate insulator layer 311 on the surface of the fin 23, a first dummy gate layer 312 on the first dummy gate insulator layer 311, and first spacer layers 313 respectively on two side surfaces of the first dummy gate layer 312.

As shown in FIG. 15B and FIG. 5C, the resistance device may further include an inter-layer dielectric layer 41 on the trench isolation structure. The inter-layer dielectric layer 41 covers the fin 23 and the first dummy gate structure 31. The inter-layer dielectric layer 41 may include a first dielectric layer 411 on the trench isolation structure and a second dielectric layer 412 on the first dielectric layer 411. The first dielectric layer 411 covers the fin 23, and an upper surface of the first dielectric layer is flush with upper surfaces of the first dummy gate structure 31. The second dielectric layer 412 covers the upper surface of the first dummy gate structure 31. For example, the second dielectric layer 412 covers an upper surface of a first dummy gate layer 312.

As shown in FIG. 15B and FIG. 15C, the resistance device may further include a resistance material layer 60 on the inter-layer dielectric layer 41. For example, the resistance material layer 60 is located on the second dielectric layer 412. In an implementation, the resistance material layer 60 may be located above a first trench isolation portion 21, and the resistance material layer extends along a direction parallel to an extension direction of the first trench isolation portion 21. For example, the resistance material layer 60 is located above a first trench isolation portion 21 between two adjacent fins.

In the foregoing implementation, a resistance device is provided. In the resistance device, a first dummy gate structure is formed on a fin, the fin and the first dummy gate structure are covered by an inter-layer dielectric layer, and a resistance material layer is formed on the inter-layer dielectric layer. The first dummy gate structure facilitates an increase in uniformity of the inter-layer dielectric layer when planarization is performed, and also facilitates an increase in uniformity when planarization is performed on a dummy gate structure, so that the resistance device has relatively desirable uniformity. Especially in a process of manufacturing another FinFET device at the same time, this facilitates maintaining the uniformity when planarization is performed on an inter-layer dielectric layer of the another FinFET device at the same time. This can improve uniformity of the resistance device.

Preferably, a material of the resistance material layer 60 may include TiN and/or TaN. In this implementation, TiN alone may be used as the resistance material layer, TaN alone may be used as the resistance material layer, or a combination of TiN and TaN may be used together as the resistance material layer, so that a desired temperature characteristics and a desired voltage characteristics of the resistance device are achieved.

In an implementation, as shown in FIG. 15B, the resistance device may further include an electrode 34 on a fin 23 and between two first dummy gate structures 31. The electrode further facilitates an increase in the uniformity of the device.

In an implementation, as shown in FIG. 15C, the resistance device may further include at least one second dummy gate structure 32 on a first trench isolation portion 21. An upper surface of the second dummy gate structure 32 is flush with the upper surface of the first dielectric layer 411, and the second dielectric layer 412 covers the upper surface of the second dummy gate structure 32. The second dummy gate structure may prevent the inter-layer dielectric layer under the resistance material layer from having a recess. Therefore, the uniformity of the resistance device can be further improved.

In an implementation, as shown in FIG. 15C, the second dummy gate structure 32 may include: a second dummy gate insulator layer 321 on the first trench isolation portion 21, a second dummy gate layer 322 on the second dummy gate insulator layer 321, a hard mask layer 323 on the second dummy gate layer 322, and second spacer layers 324 on two side surfaces of the second dummy gate layer 322. The second dielectric layer 412 covers an upper surface of the hard mask layer 323.

Preferably, a material of the second dummy gate layer may include undoped polysilicon. Because polysilicon is undoped, and the conductivity is very low, no parasitic capacitor is basically formed between the second dummy gate layer and the resistance material layer. As such, a crosstalk between the second dummy gate layer and the resistance material layer is relatively small, facilitating improvement of the uniformity of the resistance device.

In some implementations, as shown in FIG. 15B and FIG. 15C, the resistance device may further include an insulator covering layer 62 that covers the resistance material layer 60.

In an implementation, as shown in FIG. 15A to FIG. 15C, the resistance device may further include a first contact element 71 and a second contact element 72 that pass through the insulator covering layer 62 and that are respectively connected to two ends of the resistance material layer 60.

In an implementation, as shown in FIG. 15A to FIG. 15C, the resistance device may further include an intermetal dielectric layer 64 that covers the insulator covering layer 62. The first contact element 71 and the second contact element 72 pass through the intermetal dielectric layer 64 and the insulator covering layer 62, to connect to the resistance material layer 60.

The present disclosure has been described above as various exemplary implementations in detail. To avoid obscuring a concept of the present disclosure, some details known in the art are not described. A person of ordinary skill in the art may fully understand, according to the foregoing descriptions, how to implement the technical solutions disclosed herein.

Even though some specific implementations of the present disclosure have been described in detail by using examples, a person of ordinary skilled in the art should understand that, the examples above are merely illustrative and do not limit the scope of the present disclosure. A person of ordinary skill in the art shall understand that, modifications may be made to the foregoing implementations without departing from the scope and the spirit of the present disclosure.

What is claimed is:

1. A resistance device manufacturing method, comprising:
providing a semiconductor structure, wherein the semiconductor structure comprises a substrate, a fin on the substrate, and a trench isolation structure formed around the fin, the trench isolation structure comprises first trench isolation portions at two ends of the fin extending along a direction perpendicular to an extension direction of the fin, and second trench isolation portions at two sides of the fin extending along a direction parallel to the extension direction of the fin;
forming at least one first dummy gate structure on the fin and an inter-layer dielectric layer on the trench isolation structure, wherein the inter-layer dielectric layer covers the fin and the at least one first dummy gate structure; and
forming a resistance material layer on the inter-layer dielectric layer, wherein the resistance material layer is located above the first trench isolation portions, and the resistance material layer extends along a direction parallel to an extension direction of the first trench isolation portions.

2. The method according to claim 1, wherein the resistance material layer comprises at least one of titanium nitride (TiN) and tantalum nitride (TaN).

3. The method according to claim 1, wherein the resistance material layer is between the fin and another fin on the substrate.

4. The method according to claim 1, wherein:
the inter-layer dielectric layer comprises a first dielectric layer on the trench isolation structure and a second dielectric layer on the first dielectric layer;
the first dielectric layer covers the fin;
an upper surface of the first dielectric layer is flush with an upper surface of the at least one first dummy gate structure;
the second dielectric layer covers the upper surface of the first at least one dummy gate structure; and
the resistance material layer is formed on the second dielectric layer.

5. The method according to claim 4, wherein the step of forming the at least one first dummy gate structure and the inter-layer dielectric layer comprises:
forming at least one original gate structure on the fin, by:
forming a first original gate insulator layer on the fin;
forming a first original gate layer on the first original gate insulator layer; and
forming first spacer layers on two side surfaces of the first original gate layer;
forming a first dielectric layer on the trench isolation structure, wherein the first dielectric layer covers the at least one original gate structure;
performing planarization on the semiconductor structure with the first dielectric layer to expose an upper surface of the first original gate layer;
removing the first original gate layer and a part of the first original gate insulator layer, to form a recess exposing a portion of the fin;
forming, in the recess, a first dummy gate insulator layer on the exposed portion of the fin and a first dummy gate layer on the first dummy gate insulator layer; and
forming, on the first dielectric layer, the second dielectric layer that covers an upper surface of the first dummy gate layer.

6. The method according to claim 5:
wherein, in the step of forming the at least one original gate structure, two isolated original gate structures are formed on two ends of the fin; and
wherein the method further comprises: before forming the first dielectric layer, forming an electrode on the fin between the two isolated original gate structures.

7. The method according to claim 5:
wherein the step of forming the at least one original gate structure further comprises forming a second dummy gate structure on the first trench isolation portions;
wherein, in the step of performing the planarization, the planarization causes an upper surface of the second dummy gate structure to be flush with an upper surface of the first dielectric layer; and
wherein, in the step of forming the second dielectric layer, the second dielectric layer covers the upper surface of the second dummy gate structure.

8. The method according to claim 7:
wherein forming the second dummy gate structure comprises:
forming a second dummy gate insulator layer on the first trench isolation portions;
forming a second dummy gate layer on the second dummy gate insulator layer;
forming a hard mask layer on the second dummy gate layer; and
forming second spacer layers on two side surfaces of the second dummy gate layer; and
wherein in the step of forming the second dielectric layer, the second dielectric layer covers the hard mask layer.

9. The method according to claim 8, wherein the second dummy gate layer comprises undoped polysilicon.

10. The method according to claim 1, further comprising:
forming an insulator covering layer that covers the resistance material layer; and
forming a first contact element and a second contact element that pass through the insulator covering layer and are in contact with two ends of the resistance material layer.

* * * * *